United States Patent
Kobayashi et al.

(10) Patent No.: US 9,772,352 B2
(45) Date of Patent: Sep. 26, 2017

(54) PROBER HAVING LINKAGE PORTION, METHOD FOR MANUFACTURING THE PROBER AND METHOD OF TESTING CIRCUIT BOARDS USING THE PROBER

(71) Applicant: HIOKI DENKI KABUSHIKI KAISHA, Nagano (JP)

(72) Inventors: Masashi Kobayashi, Nagano (JP); Takahiro Ogawara, Nagano (JP)

(73) Assignee: HIOKI DENKI KABUSHIKI KAISHA, Nagano (JP)

( * ) Notice: Subject to any disclaimer, the term of this patent is extended or adjusted under 35 U.S.C. 154(b) by 0 days.

(21) Appl. No.: 14/801,114

(22) Filed: Jul. 16, 2015

(65) Prior Publication Data
US 2016/0033552 A1    Feb. 4, 2016

(30) Foreign Application Priority Data

Jul. 29, 2014  (JP) .................... 2014-153547
Mar. 11, 2015  (JP) .................... 2015-048627
May 25, 2015  (JP) .................... 2015-105335

(51) Int. Cl.
*G01R 1/067*  (2006.01)
*G01R 3/00*  (2006.01)
*G01R 1/073*  (2006.01)

(52) U.S. Cl.
CPC .......... *G01R 3/00* (2013.01); *G01R 1/06727* (2013.01); *G01R 1/07342* (2013.01)

(58) Field of Classification Search
CPC ........... G01R 31/2887; G01R 1/06711; G01R 1/06705; G01R 31/2889; G01R 1/07342; G01R 1/067; G01R 1/0675; G01R 1/0735; G01R 31/2863; G01R 31/2886; G01R 31/2812; G01R 1/06727; G01R 1/06738; G01R 1/06772; G01R 1/06788;
(Continued)

(56) References Cited

U.S. PATENT DOCUMENTS 4,034,293 A * 7/1977 Roch ............... G01R 1/067
                                                324/72.5
6,023,171 A * 2/2000 Boyette, Jr. ....... G01R 1/07342
                                                324/755.07
(Continued)

FOREIGN PATENT DOCUMENTS

JP      4717144     4/2011

*Primary Examiner* — Vinh Nguyen
(74) *Attorney, Agent, or Firm* — Greenblum & Bernstein, P.L.C.

(57) ABSTRACT

A probe unit includes a probe pin and a support unit supporting the probe pin. The support unit includes first and second arms disposed at a distance along a direction in which the probe pin probes a probed object; a holding unit holding base ends of the arms; and a linking unit attached to the probe pin and linking front ends of the arms. The support unit constructs a four-bar linkage that permits linear or approximately linear movement of the probe pin in an opposite direction to the probing direction. The first and second arms have through-holes at positions slightly closer to the front ends than the base ends and positions slightly closer to the base ends than the front ends, center parts between the through-holes function as bars in the four-bar linkage, and formation positions of the through-holes function as joints in the four-bar linkage.

14 Claims, 12 Drawing Sheets

(58) Field of Classification Search
CPC ... G01R 1/06794; G01R 1/073; G01R 1/07314;
G01R 1/04; G01R 1/0483; G01R 31/04;
H01R 13/62905; H01R 29/00
See application file for complete search history.

(56) References Cited

U.S. PATENT DOCUMENTS

| | | | |
|---|---|---|---|
| 7,355,424 B2 * | 4/2008 | Romanov | G01R 1/067 324/537 |
| 7,859,278 B2 * | 12/2010 | Runge | G01R 1/07342 324/754.07 |

* cited by examiner

F I G. 1 5
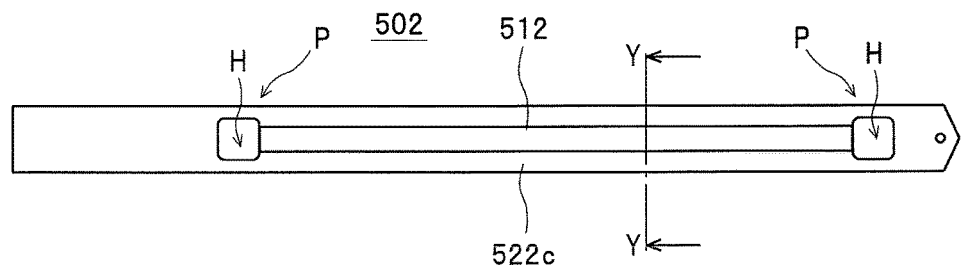
F I G. 1 6
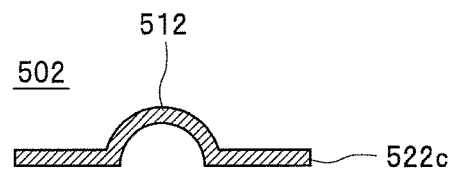
F I G. 1 7
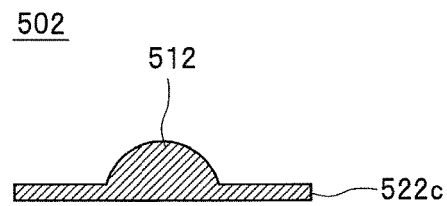

F I G. 2 4
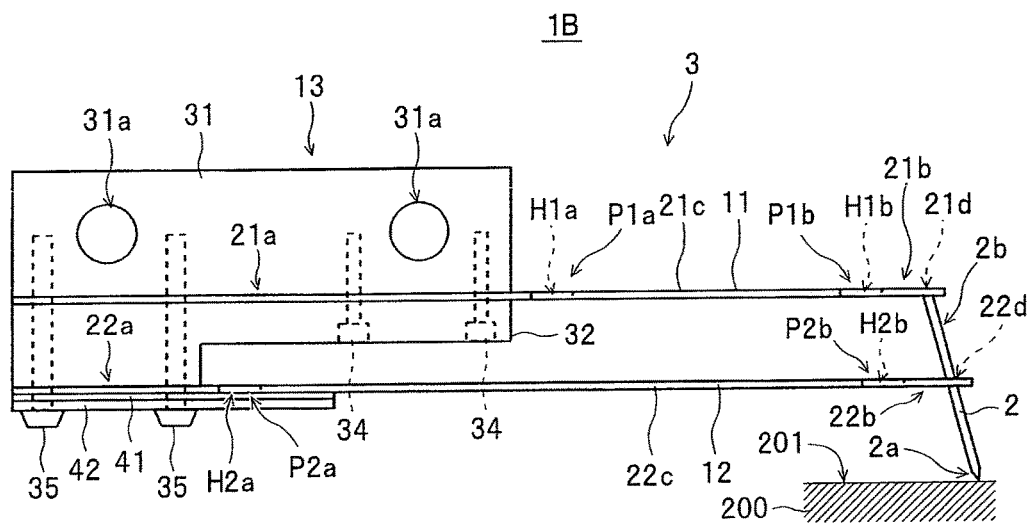
F I G. 2 5
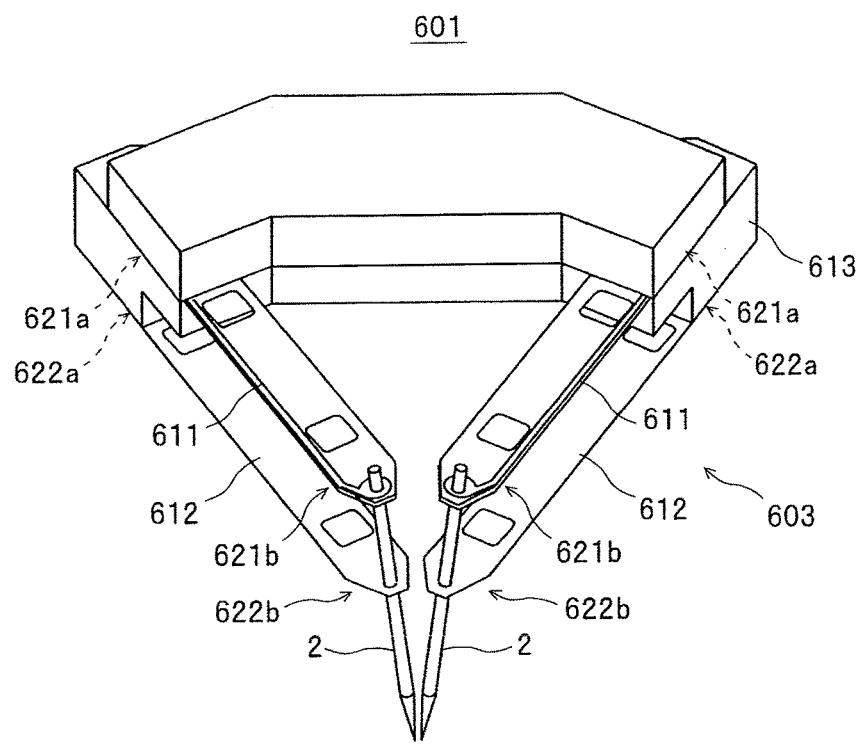

PROBER HAVING LINKAGE PORTION, METHOD FOR MANUFACTURING THE PROBER AND METHOD OF TESTING CIRCUIT BOARDS USING THE PROBER

FIELD OF THE INVENTION

The present invention relates to a probe unit equipped with a probe pin and a support portion that supports the probe pin, a method of manufacturing a probe unit for manufacturing such probe unit, and a testing method that tests a circuit board using such probe unit.

DESCRIPTION OF THE RELATED ART

A probe disclosed by the present applicant in Japanese Patent 4,717,144 is known as one example of a probe unit of this type. This probe is equipped with a probe main body and a fixture. The fixture includes a probe fixing portion that fixes the probe main body, an attaching portion for attaching to a probe guiding mechanism, and a pair of linking arms that link the probe fixing portion and the attaching portion. Fulcra, where the linking arms have been cut away in arc shapes in the thickness direction (up-down direction), are formed on the linking arms at parts that are linked to the attaching portion and at parts that are linked to the probe fixing portion. In this probe, the probe fixing portion, the attaching portion, the linking arms, and the fulcra of the fixture construct a quadric crank mechanism where linear movement, or approximately linear movement, of a probe pin in an opposite direction to the direction of probing is permitted. This means that with this probe, it is possible, when the attaching portion has been further lowered from a state where the front end of the probe main body has contacted the surface of the object to be probed, to suppress the production of contact marks due to the front end of the probe main body moving on the surface of the object to be probed.

SUMMARY OF THE INVENTION

However, by investigating the probe described above, the present inventors discovered the following problem to be solved with the above probe. With the above probe, pivots are formed by cutting away the linking arms in the thickness direction. To cause the cutaway parts to function as pivots, it is necessary to sufficiently lower the rigidity of the cutaway parts compared to other parts, and to do so, the thickness of the cutaway parts needs to clearly differ to the thickness of other parts (i.e., parts that are not cut away). This means that with the conventional probe, it is necessary to form the thickness of the linking arms (i.e., the thickness of parts that are not cut away) with a certain thickness. Meanwhile, during probing, dents are produced in the contacted object due to contact between the front end portion of the probe main body and the contacted object. Here, the larger the mass of the probe main body, the larger the dents that are produced. This means that to make the dents smaller, it is necessary to reduce the mass of the probe main body. However, with a conventional probe, as described above, it is necessary to provide the linking arms with a certain thickness, which makes it difficult to reduce the weight, creating a problem to be solved.

The present invention was conceived in view of the problem described above and it is a principal object of the present invention to provide a probe unit whose weight can be reduced, a method of manufacturing a probe unit, and a testing method that can realize the effects of such probe unit.

To achieve the stated object, a prove unit according to the present invention comprises a probe pin and a support unit that supports the probe pin, wherein the support unit includes a strip-like first arm and a strip-like second arm disposed so as to face one another at a distance along a direction of probing when the probe pin is caused to probe a probed object; a holding unit that holds base end portions of the first and second arms; and a linking unit that is constructed so as to be attachable to the probe pin and that links front end portions of the first and second arms together, the support unit constructing a four-bar linkage where linear movement or approximately linear movement of the probe pin in an opposite direction to the direction of probing is permitted, and the first and second arms are constructed so that through-holes are formed at a position that is slightly closer to the front end portion than the base end portion and a position that is slightly closer to the base end portion than the front end portion, center parts between the through-holes function as bars that construct the four-bar linkage, and formation positions of the through-holes function as joints that construct the four-bar linkage.

With the probe unit, the through-holes are respectively formed at a position that is slightly closer to the front end portion than the base end portion of the strip-like first and second arms and a position that is slightly closer to the base end portion than the front end portion, and a four-bar linkage where the center parts between the through-holes function as links and the formation positions of the through-holes function as joints is constructed by the support portion. That is, with the probe unit, by forming the through-holes in the strip-like arms to facilitate elastic deformation of the formation positions of the through-holes, the formation positions are caused to function as joints. This means that according to the probe unit, compared to a conventional configuration where arms are cut away in the thickness direction to cause such parts to function as joints (that is, a configuration where the arms need to have a certain thickness), it is possible to make the arms sufficiently thinner. The arms can therefore be made lighter, and as a result, a sufficient reduction can be made in the weight of the probe unit. Accordingly, according to the probe unit, it is possible to sufficiently reduce the size of a dent produced in the probed object due to the probe pin contacting the probed object during probing.

Also, the probe unit according to the present invention, the first and second arms are formed so that a width of edge portions located between end portions in a width direction of the first and second arms and the through-holes widens along a length direction of the first and second arms as a distance from the center parts increases.

According to the configuration described above, since it is possible to suppress the concentration of stress produced at the edge portions during probing, it is possible to reliably prevent damage to the edge portions due to the concentration of stress.

Also, the probe unit according to the present invention, the first and second arms are formed so that the two edge portions that are opposite one another with the through-holes in between produce a shape with line symmetry about a center line along the length direction that passes a center in the width direction of the first and the second arms as an axis of symmetry.

According to the configuration described above, since the stress produced at the two edge portions that are opposite one another with the through-holes in between is with line symmetry with the center lines as the axes of symmetry, it is possible to further suppress the concentration of stress in the edge portions. As a result, it is possible to prevent damage to the edge portions more reliably.

Also, the probe unit according to the present invention, the probe pin is fixed to the front end portion of the first arm and to the front end portion of the second arm and the probe unit is configured so that the probe pin functions as the linking portion.

According to the configuration described above, compared to a configuration equipped with a linking member as a separate member to the probe pin, it is possible to further reduce the weight of the probe unit.

Also, the probe unit according to the present invention, the first and second arms include ribs formed in the center parts along the length direction of the first and second arms.

According to the configuration described above, since it is possible to increase the rigidity of the central parts with the ribs compared to other parts (in particular, the formation positions of the through-holes), it is possible to further facilitate elastic deformation of the formation positions of the through-holes. Accordingly, according to this probe unit, it is possible to further suppress dents produced in the probed object during probing.

Also, the probe unit according to the present invention comprises a pair of the probe pins, a pair of the first arms, and a pair of the second arms, wherein the holding unit holds the base end portions of the first arms in a state where the pair of first arms extend adjacent to one another and holds the base end portions of the second arms in a state where the pair of second arms extend adjacent to one another.

According to the configuration described above, it is possible to support the pair of probe pins by the support portion. This means that according to this probe unit, the probe unit can be favorably used when measuring or testing according to a four terminal method or a four terminal pair method where a single probing position to be probed is probed using two probe pins and it is possible to sufficiently suppress the size of a dent produced by impacts by the probe pins during probing.

Also, the probe unit according to the present invention, the first arms are constructed by integrally fabricating the first arms in a state where a positional relationship when the base end portions of the first arms are held by the holding portion is maintained and then separating a range of the first arms from at least a vicinity of the base end portions to the front end portions in a state where the base end portions are held by the holding unit, and the second arms are constructed by integrally fabricating the second arms in a state where a positional relationship when the base end portions of the second arms are held by the holding portion is maintained and then separating a range of the second arms from at least a vicinity of the base end portions to the front end portions in a state where the base end portions are held by the holding unit.

According to the configuration described above, it is possible to fabricate the pair of first arms and the pair of second arms in single operations with the same fabrication conditions (the same machining conditions using materials with the same properties and/or the same part of the same material), which means that it is possible to suppress fluctuations in specification such as the dimensions and modulus of elasticity of the arms due to fluctuations in materials and differences in the conditions. Also, according to the probe unit described above, since it is possible to hold the first arms and the second arms using the holding unit in a state where the positional relationship when the first arms and the second arms were integrally fabricated is maintained, it is possible to reliably prevent the production of positional displacements between the first arms and between the second arms when the first arms and the second arms are held using the holding portion. Accordingly, according to the above probe unit, it is possible to realize accurate probing.

Also, the probe unit according to the present invention, the first arms are nonconductive, are integrally fabricated in a state where the base end portions are linked together, and are held by the holding unit in a state where the base end portions are still linked together, and the second arms are nonconductive, are integrally fabricated in a state where the base end portions are linked together, and are held by the holding unit in a state where the base end portions are still linked together.

According to the configuration described above, it is possible to hold the first arms and the second arms on the holding portion in a single operation. As a result, it is possible to sufficiently improve the assembly efficiency.

Also, the probe unit according to the present invention comprises a shield plate that is conductive and is disposed, via an insulator, on a surface of an arm, out of the first arm and the second arm, that is positioned closer to the probed object during probing, the surface of the arm being a surface that faces the probed object.

According to the configuration described above, since it is possible to sufficiently lower the stray capacitance between the arm and the probed object, it is possible to reliably prevent a drop in testing precision due to stray capacitance.

Also, the method of manufacturing a probe unit according to the present invention manufactures the probe unit described above and comprises fabricating the first arms by integrally fabricating the first arms in a state where a positional relationship when the base end portions of the pair of first arms are held by the holding portion is maintained and then separating a range of the first arms from at least a vicinity of the base end portions to the front end portions and fabricating the second arms by integrally fabricating the second arms in a state where a positional relationship when the base end portions of the pair of second arms are held by the holding portion is maintained and then separating a range of the second arms from at least a vicinity of the base end portions to the front end portions.

According to the method of manufacturing a probe unit described above, it is possible to fabricate a pair of first arms and a pair of second arms in single operations according to the same fabrication conditions (the same machining conditions using materials with the same properties and/or the same part of the same material). This means that according to this method of manufacturing a probe unit, it is possible to suppress fluctuations in specification such as the dimensions and modulus of elasticity of the arms due to fluctuations in materials and differences in the conditions, and as a result it is possible to manufacture a probe unit capable of accurate probing.

Also, the method of manufacturing a probe unit according to the present invention, the range of the first arms from at least a vicinity of the base end portions to the front end portions is separated in a state where the base end portions of the integrally fabricated first arms are held by the holding portion in the state, and the range of the second arms from at least a vicinity of the base end portions to the front end portions is separated in a state where the base end portions of the integrally fabricated second arms are held by the holding portion.

According to the method of manufacturing a probe unit described above, since it is possible to hold the first arms and the second arms using the holding unit in a state where the positional relationship when the first arms and the second arms were integrally fabricated is maintained, it is possible to reliably prevent the production of positional displacements between the first arms and between the second arms when the first arms and the second arms are held using the holding portion. Accordingly, according to the above method of manufacturing a probe unit, it is possible to manufacture a probe unit capable of more accurate probing.

Also, the testing method according to the present invention that tests a circuit board, comprising probing a circuit board as a probed object with the probe pin of the above probe unit, and testing the circuit board based on electrical signals inputted and outputted via the probe pin.

According to the method of testing a circuit board described above, it is possible to sufficiently reduce the size of a dent produced in the circuit board due to the probe pin contacting the circuit board during probing.

It should be noted that the disclosure of the present invention relates to the contents of Japanese Patent Application 2014-153547 that was filed on Jul. 29, 2014, Japanese Patent Application 2015-48627 that was filed on Mar. 11, 2015, and Japanese Patent Application 2015-105335 that was filed on May 25, 2015, the entire contents of which are herein incorporated by reference.

BRIEF DESCRIPTION OF THE DRAWINGS

These and other objects and features of the present invention will be explained in more detail below with reference to the attached drawings, wherein:

FIG. 15 is a plan view depicting the configuration of another arm;

FIG. 16 is a cross-sectional view along a line Y-Y in FIG. 15;

FIG. 17 is a cross-sectional view depicting another example configuration of a rib of another arm;

FIG. 24 is a side view of another probe unit;

FIG. 25 is a perspective view depicting the configuration of another probe unit;

DESCRIPTION OF THE PREFERRED EMBODIMENTS

Embodiments of a probe unit, a method of manufacturing a probe unit, and a testing method will now be described with reference to the attached drawings.

Figure 1:
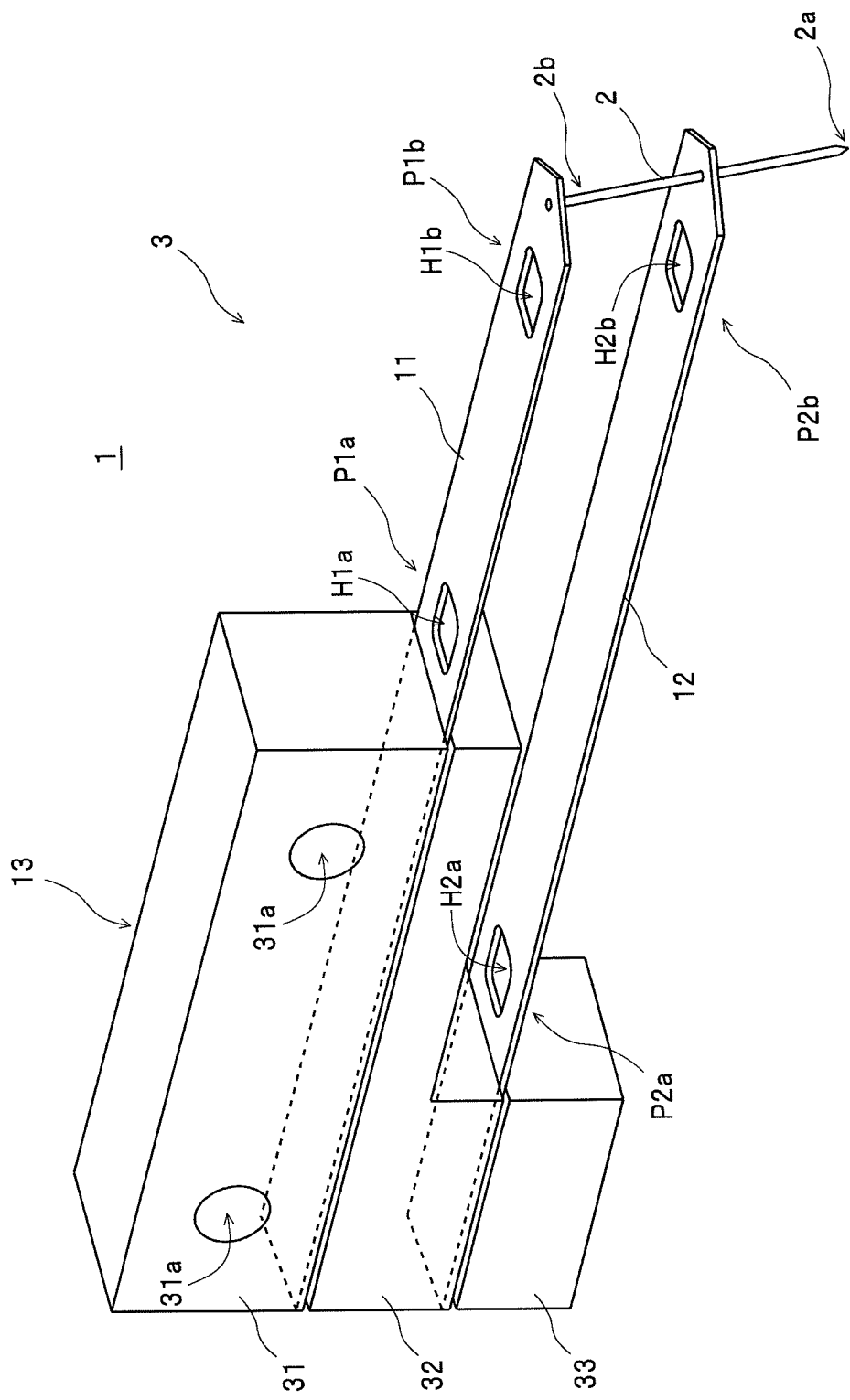
FIG. 1 is a perspective view depicting the configuration of a probe unit.

First, the configuration of a probe unit 1 depicted in FIG. 1 will be described as one example of a probe unit. As depicted in FIG. 1, the probe unit 1 includes a probe pin 2 and a support portion 3.

As depicted in FIG. 1, the probe pin 2 is formed in a cylindrical shape with a pointed front end portion 2a. When the probe unit 1 has been moved by a movement mechanism 300 (see FIG. 2), the front end portion 2a of the probe pin 2 is caused to probe (contact) an object to be probed (as one example, a circuit board 200 depicted in FIG. 2).

The support portion 3 is configured so as to be capable of supporting the probe pin 2. More specifically, as depicted in FIGS. 1, 2, the support portion 3 includes an arm 11 (or "first arm"), an arm 12 (or "second arm"), and a holding portion 13.

As depicted in FIGS. 1 to 4, the arms 11, 12 are formed as strips (long thin plates). Here, as one example, the arms 11, 12 are formed of metal and are conductive. The arms 11, 12 are disposed with their surfaces facing one another and are separated in a direction of probing when probing is carried out using the probe pin 2 (the downward direction in FIG. 2). The base end portions 21a, 22a of the arms 11, 12 are held by the holding portion 13.

Figure 2:
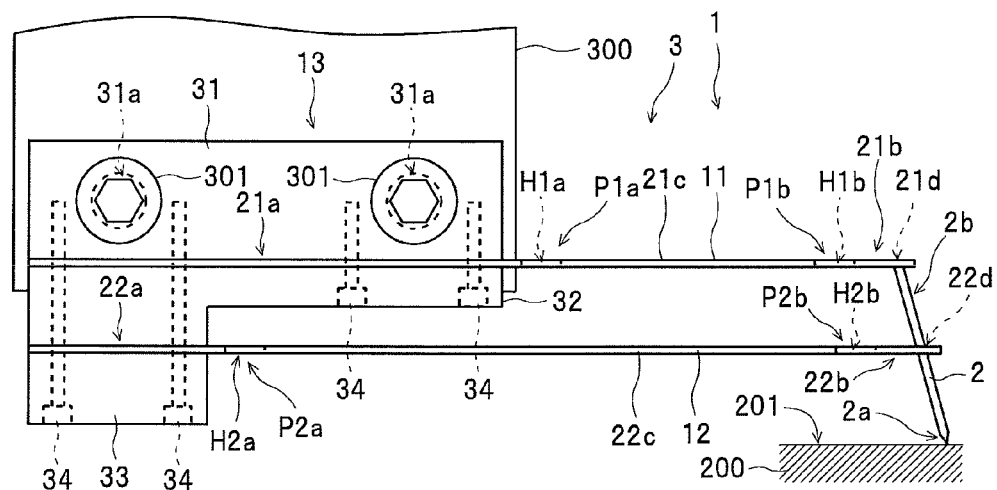
FIG. 2 is a side view of the probe unit in a state where the probe unit is fixed to a movement mechanism.
Figure 3:
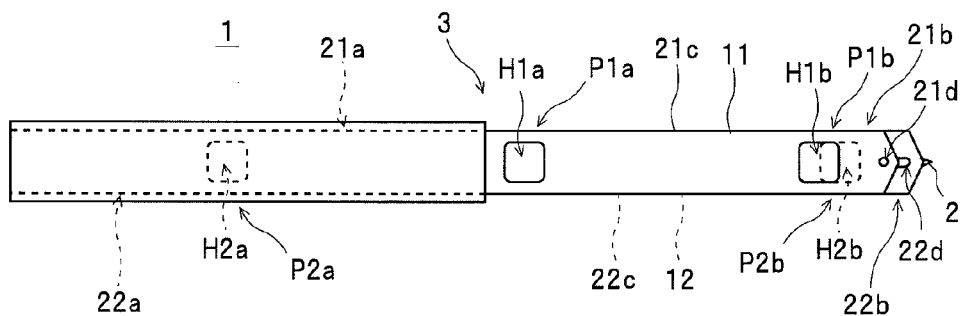
FIG. 3 is a plan view of the probe unit.
Figure 4:
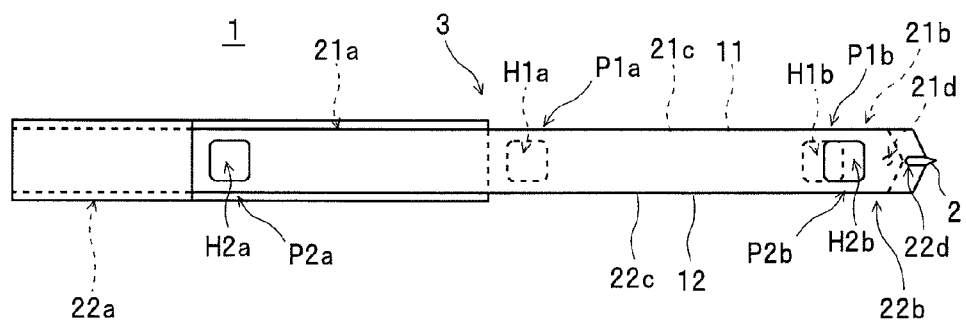
FIG. 4 is a bottom view of the probe unit.

Also, as depicted in FIGS. 2 to 4, a through-hole H1a is formed at a position on the arm 11 that is slightly closer to a front end portion 21b than the base end portion 21a and a through-hole H1b is formed at a position on the arm 11 that is slightly closer to the base end portion 21a than the front end portion 21b. Similarly, a through-hole H2a is formed at a position on the arm 12 that is slightly closer to a front end portion 22b than the base end portion 22a and a through-hole H2b is formed at a position on the arm 12 that is slightly closer to the base end portion 22a than the front end portion 22b. Note that in the following description, the through-holes H1a, H1b, H2a, and H2b are referred to as the "through-holes H" when no distinction is made therebetween.

Here, due to the through-holes H being formed in the arms 11, 12, there is a sufficient drop in the rigidity of formation positions P1a, P1b, P2a, P2b (see FIGS. 1 to 4: hereinafter referred to as the "formation positions P" when no distinction is made therebetween) compared to the rigidity of other positions on the arms 11, 12, which facilitates elastic deformation at the formation positions P.

Also, as depicted in FIGS. 2 to 4, insertion holes 21d, 22d for inserting and fixing a base end portion 2b of the probe pin 2 are respectively formed in the front end portions 21b, 22b of the arms 11, 12.

As depicted in FIGS. 1 and 2, the holding portion 13 is constructed of three holding members 31 to 33 and holds the base end portions 21a, 22a of the arms 11, 12. Here, as depicted in FIG. 2, the holding portion 13 is constructed with the arm 11 sandwiched between the holding members 31, 32, with the arm 12 sandwiched between the holding members 32, 33, and with the base end portions 21a, 22a of the arms 11, 12 being held by fixing screws 34 inserted through insertion holes in the holding members 32, 33 and screwed into screw holes in the holding member 31. Fixing holes 31a for fixing the probe unit 1 to the movement mechanism 300 are also formed in the holding member 31.

As depicted in FIG. 2, with the probe unit 1, the base end portion 2b side of the probe pin 2 is fixed to the front end portions 21b, 22b of the arms 11, 12 so that the front end portions 21b, 22b are linked by the probe pin 2. That is, in the probe unit 1, the probe pin 2 is configured so as to function as a linking portion. In this case, it is possible to use a variety of methods as the method of fixing the base end portion 2b side of the probe pin 2 to the front end portions 21b, 22b of the arms 11, 12, such as an adhesive method using a conductive adhesive, a method of welding using brazing or a laser, and a method where the base end portion 2b of the probe pin 2 is press-fitted into the insertion holes 21d, 22d of the arms 11, 12.

Next, an example of the dimensions of the various component elements that construct the probe unit 1 will be described with reference to the drawings. The probe pin 2 is formed with an overall length of 4 mm and a diameter of 0.2 mm. As depicted in FIG. 2, the probe pin 2 is fixed to the front end portions 21b, 22b in a state where the base end portion 2b is inserted through the insertion holes 21d, 22d formed in the front end portions 21b, 22b of the arms 11, 12 of the support portion 3 and where the distance between the part inserted through the insertion hole 21d (the end portion at the top in FIG. 2) and the part inserted through the insertion hole 22d of the arm 12 (the central part in the up-down direction in FIG. 2) is 2 mm.

The arm 11 of the support portion 3 is formed with an overall length of 12.7 mm, a width of 1 mm, and a thickness of 0.05 mm. The length of the part of the arm 11 that extends from the front end portion of the holding member 31 of the support portion 3 (i.e., the end portion on the right in FIG. 1) is set at 6 mm. The through-holes H1a, H1b of the arm 11 are formed in substantially rectangular shapes with sides that are 0.6 mm long. The through-hole H1a is formed at a position where the distance between the front end portion of the holding member 31 and an edge portion of the through-hole H1a on the holding member 31 side is 0.2 mm. The through-hole H1b is formed at a position where the distance between the insertion hole 21d (see FIG. 2), which is formed in the front end portion 21b of the arm 11 and through which the probe pin 2 is inserted, and an edge portion of the through-hole H1b on the insertion hole 21d side is 0.3 mm.

The arm 12 of the support portion 3 is formed with an overall length of 13 mm, a width of 1 mm, and a thickness of 0.05 mm. The length of the part of the arm 12 that extends from the front end portion of the holding member 33 of the support portion 3 (i.e., the end portion on the right in FIG. 1) is set at 10 mm. The through-holes H2a, H2b of the arm 12 are formed in substantially rectangular shapes with sides that are 0.6 mm long. The through-hole H2a is formed at a position where the distance between the front end portion of the holding member 33 and an edge portion of the through-hole H2a on the holding member 33 side is 0.2 mm. The through-hole H2b is formed at a position where the distance between the insertion hole 22d (see FIG. 2), which is formed in the front end portion 22b of the arm 12 and through which the probe pin 2 is inserted, and an edge portion of the through-hole H2b on the insertion hole 22d side is 0.3 mm. Note that the dimensions of the respective component elements described above are mere examples and can be changed as appropriate.

Figure 5:
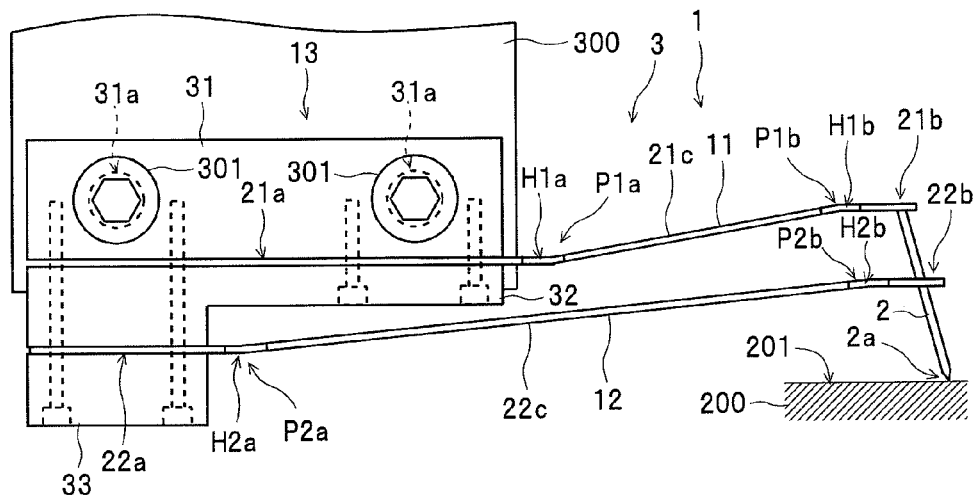
FIG. 5 is a first diagram useful in explaining the operation of the probe unit.
Figure 6:
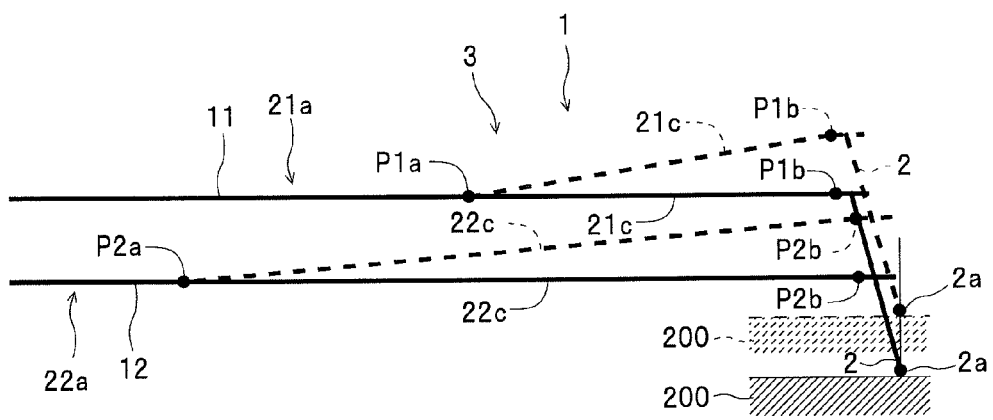
FIG. 6 is a second diagram useful in explaining the operation of the probe unit.

Here, in the probe unit 1, as described above elastic deformation of the arms 11, 12 is facilitated at the formation positions P of the through-holes H. This means that in the probe unit 1, as depicted in FIG. 5, in a state where the holding portion 13 is fixed to the movement mechanism 300, when force is applied to the front end portion 2a of the probe pin 2 in the opposite direction (upward in FIG. 5) to the direction of probing, a center part 21c of the arm 11, a center part 22c of the arm 12, the front end portions 21b, 22b of the arms 11, 12 and the probe pin 2 rotate (move) with the formation positions P as pivots. As depicted in FIG. 6, such rotating operation of the various component elements of the probe unit 1 is the same as a rotating operation of a four-bar linkage (quadric crank mechanism) where the center parts 21c, 22c function as links (bars) and the formation positions P function as joints (pivots). That is, in the probe unit 1, the arms 11, 12, the holding portion 13, and the probe pin 2 that functions as a linking portion construct a four-bar linkage. Also, in the probe unit 1, the lengths of the arms 11, 12 (the center parts 21c, 22c) and the interval between the arms 11, 12 are set so that when force is applied to the probe pin 2 in the opposite direction (upward in FIG. 6) to the direction of probing, linear movement or approximately linear movement of the front end portion 2a of the probe pin 2 is permitted, as depicted in FIG. 6.

Also in the probe unit 1, by forming the through-holes H in the arms 11, 12 that are formed as strips to facilitate elastic deformation at the formation positions P of the through-holes H, the formation positions P are caused to function as joints. This means that with the probe unit 1, compared to a conventional configuration where arms are cut away in the thickness direction to cause such parts to function as joints, that is, a configuration where the arms need to have a certain thickness, it is possible to make the arms 11, 12 sufficiently thinner. As a result, the arms 11, 12 can be made lighter and a corresponding reduction can be made in the weight of the probe unit 1.

Next, a testing method that uses the probe unit 1 to test the circuit board 200 as one example of a probed object, and the operation of the probe unit 1 during probing will be described in detail with reference to the drawings.

As depicted in FIG. 2, the probe unit 1 is fixed to the movement mechanism 300 by inserting fixing screws 301 through the fixing holes 31a formed in the holding member 31 of the holding portion 13 and screwing the fixing screws 301 into screw holes on the movement mechanism 300.

When probing has been indicated to the movement mechanism 300, the movement mechanism 300 moves the probe unit 1 above the circuit board 200 as the probed object. Next, the movement mechanism 300 lowers the probe unit 1 (i.e., the probe unit 1 is moved downward). After this, due to the lowering of the probe unit 1, as depicted in FIG. 2, the front end portion 2a of the probe pin 2 is placed in contact with a surface 201 of the circuit board 200.

Next, as depicted in FIG. 5, the movement mechanism 300 further lowers the probe unit 1. Due to such lowering, the front end portion 2a of the probe pin 2 applies downward pressure onto the surface 201 of the circuit board 200. A reactive force to the downward pressure acts in the upward direction on the front end portion 2a of the probe pin 2. At this time, as depicted in FIG. 5, the center part 21c of the arm 11, the center part 22c of the arm 12, the front end portions 21b, 22b of the arms 11, 12, and the probe pin 2 rotate according to the same operation as a four-bar linkage with the formation positions P on the arms 11, 12 as pivots. More specifically, the center part 21c rotates anticlockwise in FIG. 5 with the formation position P1a as a pivot, and the center part 22c rotates anticlockwise in FIG. 5 with the formation position P2a as a pivot. The front end portions 21b, 22b that are linked by the probe pin 2 and the probe pin 2 itself rotate clockwise in FIG. 5 with the formation positions P1b, P2b as pivots.

Next, the movement mechanism 300 stops the lowering at a point where the probe unit 1 has been lowered by a distance that is decided in advance.

With the probe unit 1, as described above, the lengths of the arms 11, 12 and the interval between the arms 11, 12 are set so that linear movement or approximately linear movement of the front end portion 2a of the probe pin 2 is permitted (see FIG. 6). For this reason, from when the front end portion 2a of the probe pin 2 comes into contact with the surface 201 of the circuit board 200 until the lowering of the probe unit 1 stops, a state is maintained where the front end portion 2a is positioned at the initial contact position. This means that with the probe unit 1, it is possible to reliably prevent the production of scratches due to the front end portion 2a of the probe pin 2 moving on the surface 201 of the circuit board 200.

Also, with this probe unit 1, as described above, since the arms 11, 12 are made thinner and sufficiently lighter, it is possible to reduce the weight of the probe unit 1. This means that it is also possible to sufficiently reduce the size of a dent produced in the surface 201 of the circuit board 200 due to the front end portion 2a of the circuit board 200 contacting the circuit board 200 (the probed object) during probing.

Next, a circuit board testing apparatus, not depicted, carries out testing of the circuit board 200 based on electrical signals inputted and outputted via the probe pin 2.

After this, when testing ends and the movement mechanism 300 is instructed to end the probing, the movement mechanism 300 raises the probe unit 1 (the holding portion 13). Due to this, the pressing force applied by the probe pin 2 onto the surface 201 of the circuit board 200 is released and the reactive force to such pressing force that acts upon the front end portion 2a of the probe pin 2 in the upward direction is also released. At this time, the center parts 21c, 22c of the arms 11, 12, the front end portions 21b, 22b of the arms 11, 12, and the probe pin 2 operate as a four-bar linkage, that is, rotate in the opposite directions to the directions during probing described above, and return from the state depicted in FIG. 5 to the initial state depicted in FIG. 2.

By doing so, probing on the circuit board 200 by the probe pin 2 of the probe unit 1 and the releasing of probing are completed.

In this way, with the probe unit 1, the through-holes H are respectively formed at a position that is slightly closer to the front end portion 21b than the base end portion 21a of the strip-like arms 11, 12 and a position that is slightly closer to the base end portion 21a than the front end portion 21b, and a four-bar linkage where the center parts 21c, 22c between the through-holes H function as links and the formation positions P of the through-holes H function as joints is constructed by the support portion 3. That is, with the probe unit 1, by forming the through-holes H in the strip-like arms 11, 12 to facilitate elastic deformation of the formation positions P of the through-holes H, the formation positions P are caused to function as joints. This means that according to the probe unit 1, compared to a conventional configuration where arms are cut away in the thickness direction to cause such parts to function as joints (that is, a configuration where the arms need to have a certain thickness), it is possible to make the arms 11, 12 sufficiently thinner. The arms 11, 12 can therefore be made lighter, and as a result, a sufficient reduction can be made in the weight of the probe unit 1. Accordingly, according to the probe unit 1, it is possible to sufficiently reduce the size of a dent produced in the probed object due to the probe pin 2 contacting the probed object (the circuit board 200) during probing.

Also, according to the probe unit 1, by constructing the probe unit 1 so that the probe pin 2 functions as a linking portion, compared to a configuration equipped with a linking member as a separate member to the probe pin 2, it is possible to further reduce the weight of the probe unit 1. This means that according to the probe unit 1, it is possible to further reduce the size of a dent produced in the probed object due to the probe pin 2 contacting the probed object (the circuit board 200) during probing.

Also, according to this testing method, by testing the circuit board 200 as the probed object using the probe unit 1 described above, it is possible to realize the effects described above of the probe unit 1, that is, it is possible to realize an effect of sufficiently suppressing the size of a dent produced in the circuit board 200 during probing.

Next, the configuration of a probe unit 101 depicted in FIG. 7 will be described as another example of a probe unit. Note that in the following explanation, component elements that are the same as the probe unit 1 described above have been assigned the same numerals and duplicated description thereof is omitted.

Figure 7:
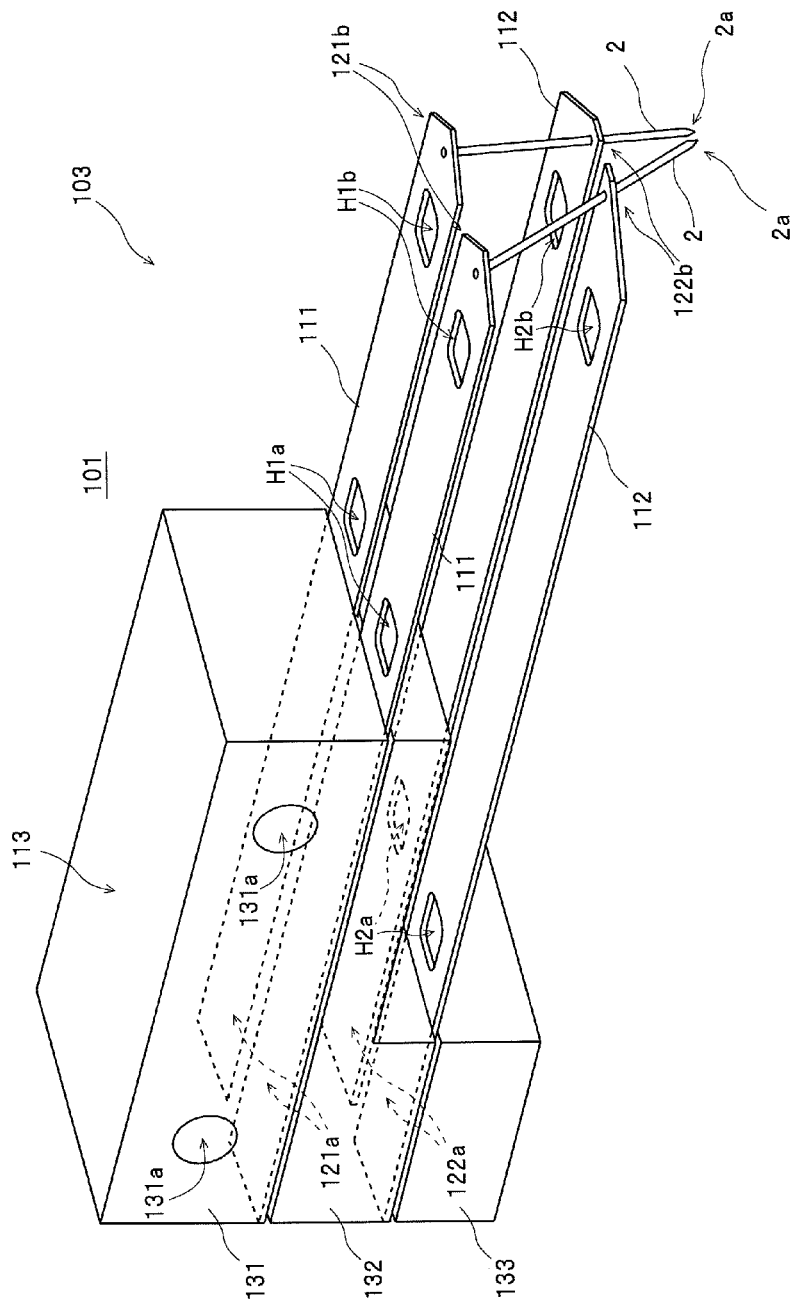
FIG. 7 is a perspective view depicting the configuration of another probe unit.

As depicted in FIG. 7, the probe unit 101 includes a pair of probe pins 2 and a support portion 103. The support portion 103 includes a pair of arms 111 (first arms), a pair of arms 112 (second arms), and a holding portion 113. In the same way as the arms 11, 12 of the probe unit 1, the arms 111, 112 are formed as strips using metal. Also, in the same way as the arms 11, 12, through-holes H are formed in the arms 111, 112.

As depicted in FIG. 7, the holding portion 113 is constructed of three holding members 131 to 133, the base end portions 121a of the arms 111 are held in a state where the arms 111 extend adjacent to one another in parallel (a layout where the arms 111 are adjacently disposed on a single virtual plane), and the base end portions 122a of the arms 112 are held in a state where the arms 112 extend adjacent to one another in parallel (a layout where the arms 112 are adjacently disposed on a single virtual plane). Also, fixing holes 131a for fixing the probe unit 101 to the movement mechanism 300 are formed in the holding member 131.

In the probe unit 101, the pair of probe pins 2 are supported by the support portion 103. This means that the probe unit 101 can be favorably used when measuring or testing according to a four terminal method or a four terminal pair method where a single probing position to be probed is probed using two probe pins 2. Also, in the probe unit 101, it is possible to realize the same effects as the probe unit 1 described above, that is, preventing the production of scratches due to the probe pins 2 moving during probing and suppression of dents produced by impacts by the probe pins 2 during probing. Also with a testing method that uses the probe unit 101, it is possible to realize the same effects as the testing method that uses the probe unit 1 described above.

Figure 8:
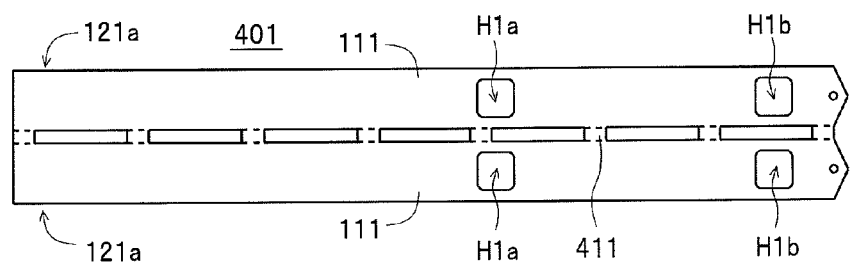
FIG. 8 is a first diagram useful in explaining the method of fabricating other arms.

Next, a method of manufacturing a probe unit that manufactures the probe unit 101 described above will be described focusing on the method of fabricating the arms 111, 112. When fabricating the arms 111 used in the probe unit 101, as depicted in FIG. 8, first an intermediate member 401 where the pair of arms 111 are integrated is fabricated. As depicted in FIG. 8, this intermediate member 401 has a form where the arms 111 are linked by linking portions 411 in a state where the positional relationship (see FIG. 7) when the base end portions 121a of the pair of arms 111 are held by the holding portion 113 is maintained. Here, as the method of fabricating the intermediate member 401, it is possible to use a method of fabricating that uses electrocasting, a method that uses a press, or a method of fabricating that uses milling.

Figure 9:
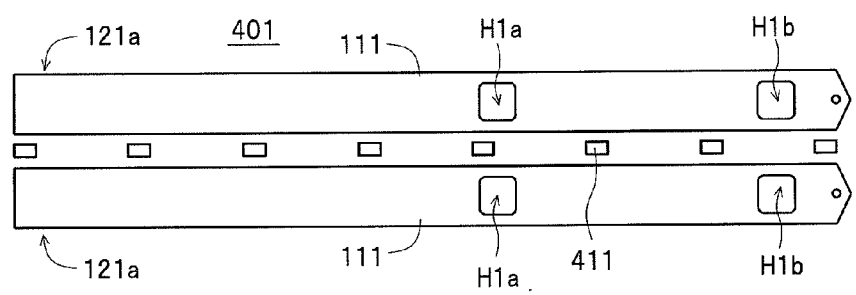
FIG. 9 is a second diagram useful in explaining the method of fabricating other arms.

Next, the linking portions 411 of the intermediate member 401 (the integrated arms 111) are cut out by cutting at the positions indicated by the broken lines in FIG. 8, and then as depicted in FIG. 9, the arms 111 are separated. By doing so, the pair of arms 111 is fabricated.

Figure 10:
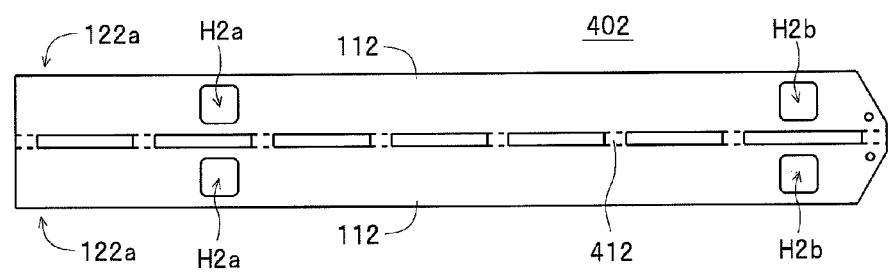
FIG. 10 is a first diagram useful in explaining the method of fabricating other arms.

Also, when fabricating the arms 112, as depicted in FIG. 10, the intermediate member 402 where the pair of arms 112 is integrated is fabricated according to the same method of fabricating as the method of fabricating the intermediate member 401. As depicted in FIG. 10, the intermediate member 402 has a form where the arms 112 are linked by linking portions 412 in a state where the positional relationship (see FIG. 7) when the base end portions 122a of the pair of arms 112 are held by the holding portion 113 is maintained.

Figure 11:
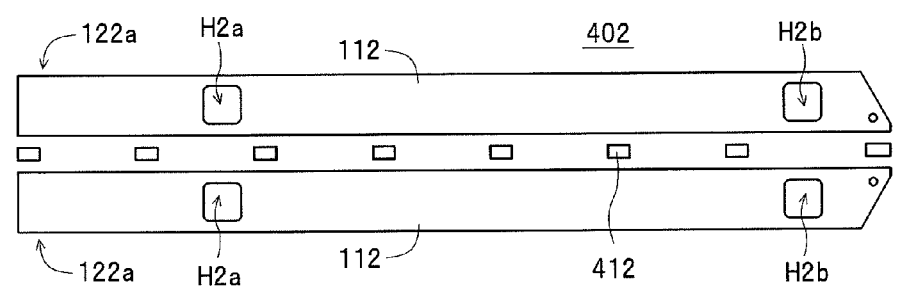
FIG. 11 is a second diagram useful in explaining the method of fabricating other arms.

After this, the linking portions 412 of the intermediate member 402 (the integrated arms 112) are cut out by cutting at the positions indicated by the broken lines in FIG. 10, and then as depicted in FIG. 11, the arms 112 are separated. By doing so, the pair of arms 112 is fabricated.

Next, the base end portions 121a, 122a of the arms 111, 112 are held by the holding portion 113. After this, the probe pins 2 are fixed to the front end portions 121b, 122b of the arms 111, 112. By doing so, the probe unit 101 is manufactured.

According to this method of manufacturing, by fabricating the arms 111, 112 according to the method of fabricating described above, it is possible to fabricate the pair of arms 111 according to the same fabrication conditions and to fabricate the pair of arms 112 according to the same fabrication conditions. More specifically, when fabricating the arms 111, 112 according to electrocasting for example, it is possible to fabricate the arms 111 and the arms 112 at the same time using the same electrocasting material and according to the same electrocasting conditions, while when fabricating the arms 11, 112 using a press or milling for example, it is possible to fabricate the arms 111 and the arms 112 at the same time using the same part of a material being machined (a metal plate or metal block) with the same pressing conditions or the same milling conditions. This means that according to this method of manufacturing, it is possible to suppress fluctuations in specification such as the dimensions and modulus of elasticity of the arms 111, 112 due to fluctuations in materials and differences in the conditions. As a result, it is possible to manufacture a probe unit 101 capable of accurate probing. Also, according to a testing method that uses the probe unit 101, it is possible to carry out accurate probing.

Note that although in the example described above, the probe unit 101 is manufactured by holding the base end portions 121a, 122a of the arms 111, 112 using the holding portion 113 after the intermediate members 401, 402 (the arms 111 and 112 that are respectively integrated) have been cut and separated into the pair of arms 111 and the pair of arms 112, it is also possible to manufacture the probe unit 101 as follows. First, after the intermediate members 401, 402 have been fabricated, only the parts on the base end portion 121a, 122a sides of the arms 111, 112 of the intermediate members 401, 402 are separated. After this, in this state (a state where the parts aside from the base end portion 121a, 122a sides are connected and the arms 111, 112 are respectively integrated), the base end portions 121a, 122a are held using the holding portion 113. Next, in this state, the intermediate members 401, 402 are separated from the vicinity of the base end portions 121a, 122a to the front end portions 121b, 122b. That is, at this time, the arms 111, 112 become separated from the base end portions 121a, 122a to the front end portions 121b, 122b. With the probe unit 101 manufactured in this way, since it is possible to hold the arms 111 and the arms 112 using the holding portion 113 in a state where the positional relationship between the arms 111 and the arms 112 when the intermediate members 401, 402 were formed is maintained, it is possible to reliably prevent the production of positional displacements between the arms 111 and between the arms 112 when the arms 111 and the arms 112 are held using the holding portion 113. This means that according to this method of manufacturing, it is possible to manufacture the probe unit 101 that is capable of much more accurate probing. Also, according to a testing method that uses the probe unit 101, it is possible to carry out much more accurate probing.

Figure 12:
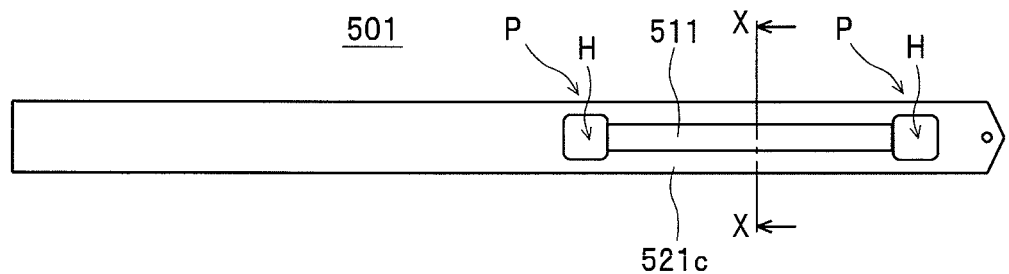
FIG. 12 is a plan view depicting the configuration of other arms.
Figure 13:
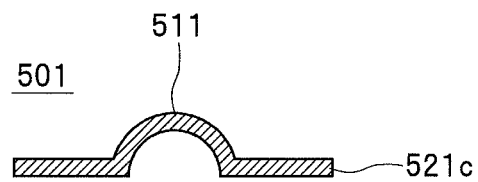
FIG. 13 is a cross-sectional view along a line X-X in FIG. 12.
Figure 14:
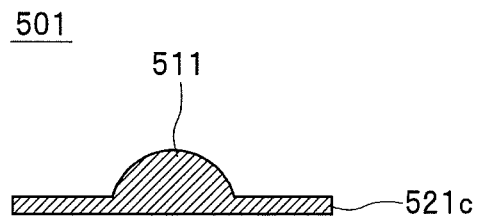
FIG. 14 is a cross-sectional view depicting another example configuration of a rib of another arm.

Note that the probe unit, the method of manufacturing a probe unit, and the testing method are not limited to the configurations and methods described above. As one example, it is possible to adopt a configuration and method that use the arms 501, 502 depicted in FIGS. 12, 15 in place of the arms 11, 12 (the arms 111, 112). As depicted in FIG. 12, the arm 501 (first arm) is equipped with a rib 511 formed along the length direction of the arm 501 in a center part 521c between the through-holes H. Here, as one example, as depicted in FIG. 13, the rib 511 is formed in a (hollow) semicylindrical shape (or a semielliptical cylindrical shape) whose cross-sectional form protrudes upward and whose diameter is 0.3 mm. As one example, the arm 501 is formed with a width of 1 mm and as depicted in FIG. 12, the rib 511 is formed in a central portion in the width direction of the arm 501. Accordingly, the respective lengths from both end portions in the width direction of the rib 511 to both edge portions in the width direction of the arm 501 are 0.35 mm. Note that as depicted in FIG. 14, it is also possible to form the rib 511 with a solid semicylindrical (semielliptical cylindrical) form.

As depicted in FIG. 15, the arm 502 (second arm) is equipped with a rib 512 formed along the length direction of the arm 502 in a center part 522c between the through-holes H. Here, as one example, as depicted in FIG. 16, in the same way as the rib 511 of the arm 501, the rib 512 is formed in a (hollow) semicylindrical shape (a semielliptical cylindrical shape) whose cross-sectional form protrudes upward and whose diameter is 0.3 mm. As one example, the arm 502 is formed with a width of 1 mm and as depicted in FIG. 15, the rib 512 is formed in a central portion in the width direction of the arm 502. Accordingly, the respective lengths from both end portions in the width direction of the rib 512 to both edge portions in the width direction of the arm 502 are 0.35 mm. Note that as depicted in FIG. 17, it is also possible to form the rib 511 with a solid semicylindrical (semielliptical cylindrical) cross-sectional form. According to this configuration, since it is possible to increase the rigidity of the central parts 521c, 522c with the ribs 511, 512 formed in the center parts 521c, 522c compared to other parts (in particular, the formation positions P of the through-holes H), it is possible to further facilitate elastic deformation of the formation positions P where the through-holes H are formed. Accordingly, according to this configuration, it is possible to further suppress dents produced in the probed object during probing.

Also, although a configuration where the front end portions 21b, 22b (the front end portions 121b, 122b) of the arms 11, 12 (the arms 111, 112) are directly fixed to the probe pin(s) 2, that is, an example configuration where the base end portion 2b side of each probe pin 2 is caused to function as a linking portion has been described above, it is also possible to use a configuration equipped with a linking portion that is formed separately to the probe pin 2, is formed so as to be attachable to (detachable from) the probe pin 2, and links the front end portions 21b, 22b (the front end portions 121b, 122b).

Figure 18:
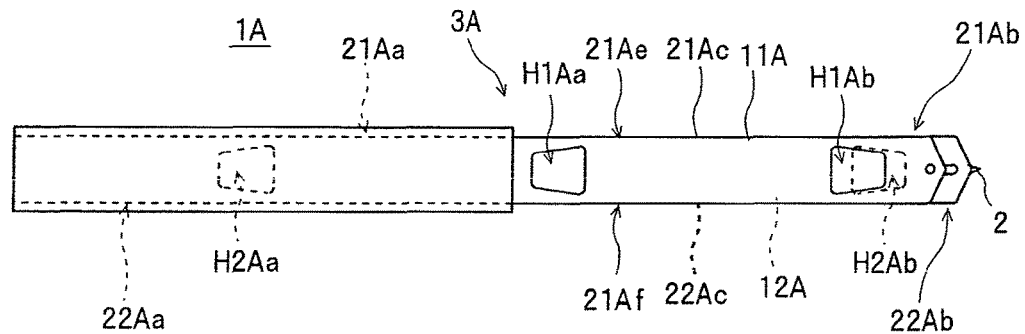
FIG. 18 is a plan view of another probe unit.

It is also possible to use a probe unit 1A depicted in FIG. 18. Note that in the following description, component elements that are the same as the probe units 1, 101 described above have been assigned the same numerals and duplicated description thereof is omitted.

Figure 19:
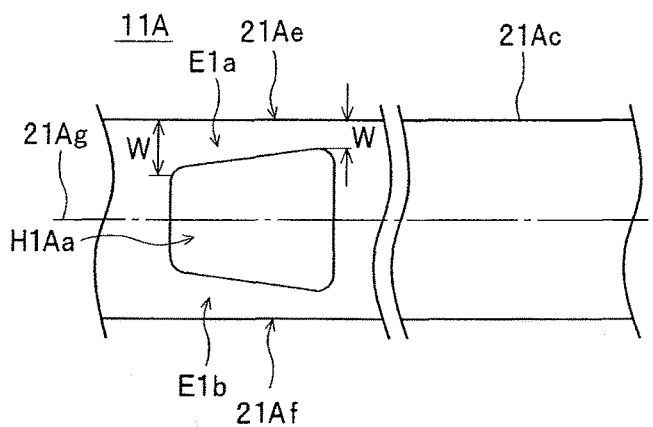
FIG. 19 is a plan view depicting the configuration in a vicinity of a through-hole of another arm.
Figure 20:
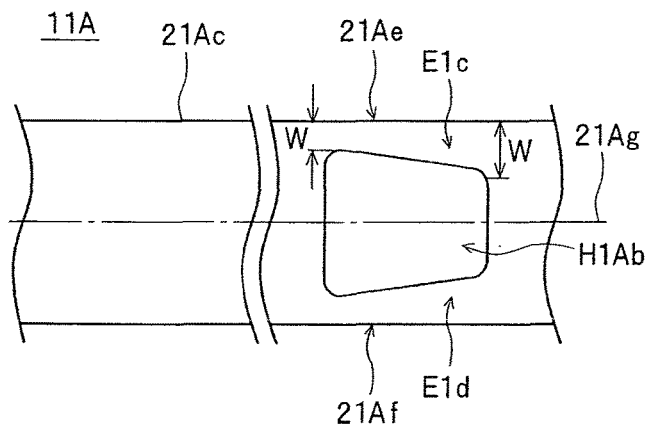
FIG. 20 is a plan view depicting the configuration in a vicinity of a through-hole of another arm.

As depicted in FIGS. 18 to 20, the probe unit 1A is formed so that the width W of edge portions E1a, E1b located between side end portions 21Ae, 21Af (end portions in the width direction) of an arm 11A that constructs a support portion 3A and a through-hole H1Aa formed at a position that is slightly closer to the front end portion 21Ab than the base end portion 21Aa of the arm 11A widens along the length direction of the arm 11A (the left-right direction in the drawings) as the distance from a center part 21Ac increases (i.e., approaching the base end portion 21Aa). As a specific example, the probe unit 1A is formed so that the width W of the edge portions E1a, E1b at the position closest to the center part 21Ac is 0.1 mm and the width W of the edge portions E1a, E1b at the position furthest from the center part 21Ac is 0.15 mm. In this case, the edge portions E1a, E1b (the two edge portions that are opposite one another with the through-hole H1Aa in between) are formed so as to produce a shape with line symmetry about a center line 21Ag along the length direction that passes a center in the width direction of the arm 11A as the axis of symmetry.

Also, as depicted in FIGS. 18 to 20, the probe unit 1A is formed so that the width W of the edge portions E1c, E1d located between the side end portions 21Ae, 21Af of the arm 11A and the through-hole H1Ab formed at a position that is slightly closer to the base end portion 21Aa than the front end portion 21Ab of the arm 11A widens as the distance from the center part 21Ac along the length direction of the arm 11A increases (i.e., approaching the front end portion 21Ab). As a specific example, the probe unit 1A is formed so that the width W of the edge portions E1c, E1d at the position closest to the center part 21Ac is 0.1 mm and the width W of the edge portions E1c, E1d at the position furthest from the center part 21Ac is 0.15 mm. In this case, the edge portions E1c, E1d (the two edge portions that are opposite one another with the through-hole H1Ab in between) are formed so as to produce a shape with line symmetry about a center line 21Ag of the arm 11A as the axis of symmetry.

Figure 21:
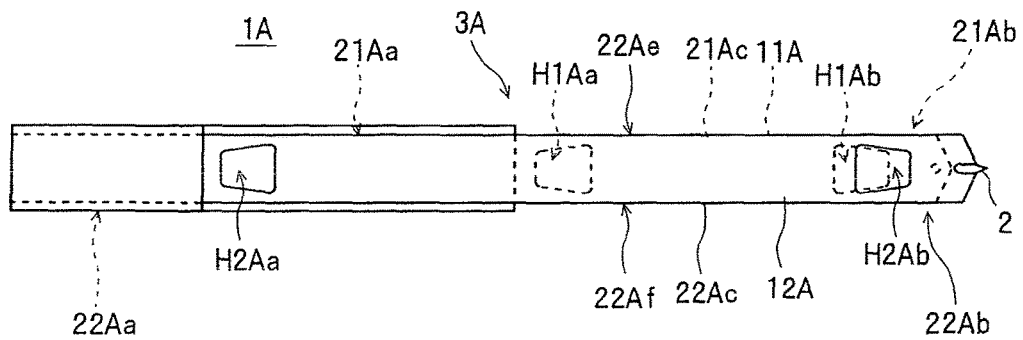
FIG. 21 is a bottom view of another probe unit.
Figure 22:
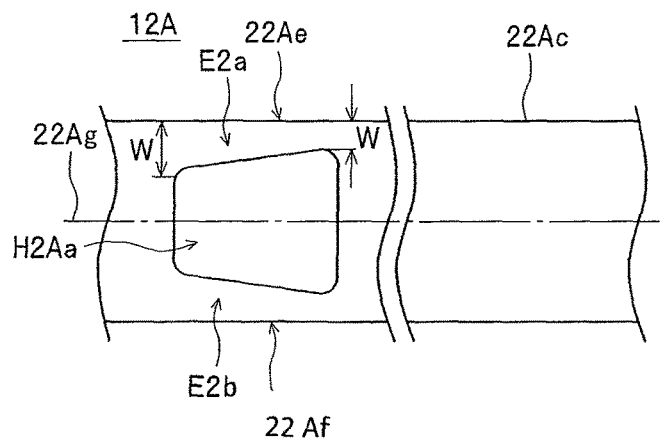
FIG. 22 is a plan view depicting the configuration in a vicinity of a through-hole of another arm.
Figure 23:
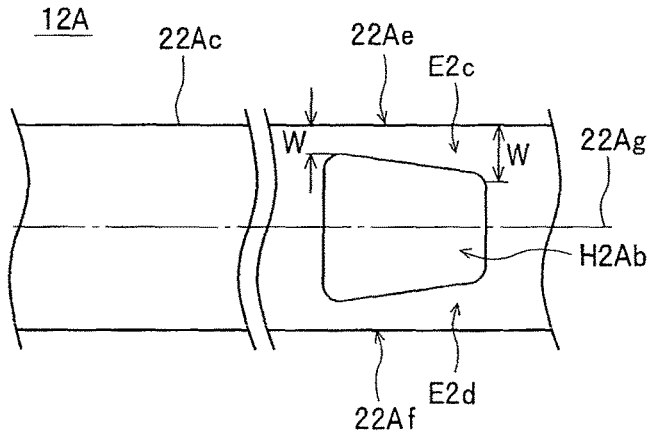
FIG. 23 is a plan view depicting the configuration in a vicinity of a through-hole of another arm.

In the same way, as depicted in FIGS. 21 to 23, the probe unit 1A is formed so that the width W of edge portions E2a, E2b located between side end portions 22Ae, 22Af (end portions in the width direction) of an arm 12A that constructs the support portion 3A and a through-hole H2Aa formed at a position that is slightly closer to the front end portion 22Ab than the base end portion 22Aa of the arm 12A widens along the length direction of the arm 12A (the left-right direction in the drawings) as the distance from a center part 22Ac increases (i.e., approaching the base end portion 22Aa). As a specific example, the probe unit 1A is formed so that the width W of the edge portions E2a, E2b at the position closest to the center part 22Ac is 0.1 mm and the width W of the edge portions E2a, E2b at the position furthest from the center part 22Ac is 0.15 mm. In this case, the edge portions E2a, E2b (the two edge portions that are opposite one another with the through-hole H2Aa in between) are formed so as to produce a shape with line symmetry about a center line 22Ag along the length direction that passes a center in the width direction of the arm 12A as the axis of symmetry.

Also, as depicted in FIGS. 21 to 23, the probe unit 1A is formed so that the width W of the edge portions E2c, E2d located between the side end portions 22Ae, 22Af of the arm 12A and the through-hole H2Ab (hereinafter, the through-holes H1Aa, H1Ab, H2Aa, H2Ab are referred to as the "through-holes H" when no distinction is required) formed at a position that is slightly closer to the base end portion 22Aa than the front end portion 22Ab of the arm 12A widens as the distance from the center part 22Ac along the length direction of the arm 12A increases (approaching the front end portion 21Ab). As a specific example, the probe unit 1A is formed so that the width W of the edge portions E1c, E1d at the position closest to the center part 22Ac is 0.1 mm and the width W of the edge portions E2c, E2d at the position furthest from the center part 22Ac is 0.15 mm. In this case, the edge portions E2c, E2d (the two edge portions that are opposite one another with the through-hole H2Ab in between) are formed so as to produce a shape with line symmetry about a center line 22Ag of the arm 12A as an axis of symmetry.

As depicted in FIGS. 18 to 23, in the probe unit 1A, by using substantially trapezoidal shapes for the through-holes H, the arms 11A, 12A are formed so that the width W of the edge portions E and the shape satisfy the conditions described above.

With the probe unit 1A, by forming the arms 11A, 12A so that the width W of the edge portions E widens as the distance from the center parts 21Ac, 22Ac increases, it is possible to suppress the concentration of stress produced at the edge portions E during probing. More specifically, with beam-like members like the arms 11A, 12A, if the form and area of a cross-section are constant at any position in the length direction of the arms 11A, 12A, the stress produced during probing will increase as the distance from the center parts 21Ac, 22Ac increases (i.e., approaching the base end portions 21Aa, 22Aa on the base end portion 21Aa, 22Aa sides and approaching the front end portions 21Ab, 22Ab on the front end portion 21Ab, 22Ab sides). This means that in a configuration where the width W of the edge portions E is constant, stress produced at the edge portions E increases as the distance from the center parts 21Ac, 22Ac increases and stress is concentrated at positions that are furthest from the center parts 21Ac, 22Ac. On the other hand, with the probe unit 1A, since the arms 11A, 12A are formed so that the width W of the edge portions E widens as the distance from the center parts 21Ac, 22Ac increases, it is possible to suppress the concentration of stress in the edge portions E.

This means that according to the probe unit 1A and a testing method that uses the probe unit 1A, it is possible to reliably prevent damage to the edge portions E due to the concentration of stress.

Also, in the probe unit 1A, since the arms 11A, 12A are formed so that the two edge portions E that are opposite one another with the through-holes H in between produce a shape with line symmetry with the center lines 21Ag, 22Ag of the arms 11A, 12A as the axes of symmetry, the distribution of stress produced at the two edge portions E that are opposite one another with the through-holes H in between has line symmetry with the center lines 21Ag, 22Ag as the axes of symmetry. That is, the distribution of stress produced at the two edge portions E that are opposite one another with the through-holes H in between is uniform in the up-down direction in FIGS. 18 to 23. This means that according to the probe unit 1A and a testing method that uses the probe unit 1A, it is possible to further suppress the concentration of stress in the edge portions E and as a result, it is possible to prevent damage to the edge portions E more reliably.

It is also possible to use a probe unit 1B depicted in FIG. 24. Note that in the following explanation, component elements that are the same as the probe units 1, 101, 1A described above have been assigned the same numerals and duplicated description thereof is omitted.

As depicted in FIG. 24, the probe unit 1B includes, in addition to the component elements provided in the probe unit 1 described above, an insulating sheet 41 and a shield plate 42. The insulating sheet 41 is one example of an insulator and is formed as a sheet of a material, such as resin, that is non-conductive (insulating). The shield plate 42 is formed in the shape of a thin plate using a conductive metal, for example, copper or aluminum. As depicted in FIG. 24, the shield plate 42 is disposed via the insulating sheet 41 (i.e., in a state that is insulated from the arm 12) on a circuit board 200-facing surface (the lower surface in FIG. 24: hereinafter referred to as the "facing surface") of the arm 12 which, out of the arms 11, 12, is positioned closer to the circuit board 200 as the probed object during probing, and is fixed to the holding portion 13 (the holding members 31, 32) by fixing screws 35. The shield plate 42 is also connected for example to ground potential (a standard potential) via wiring, not depicted.

Here, with a configuration not equipped with the shield plate 42, since the arm 12 is formed of metal, stray capacitance between the arm 12 and the probed object may increase, and there is the risk of a drop in testing precision due to the stray capacitance. On the other hand, according to the probe unit 1B, by disposing the shield plate 42 on the facing surface side of the arm 12, it is possible to sufficiently lower the stray capacitance between the arm 12 and the probed object. This means that according to the probe unit 1B and a testing method that uses the probe unit 1B, it is possible to reliably prevent a drop in testing precision due to stray capacitance. Note that even if the fixing screws 35 used to fix the shield plate 42 are made of metal, since electricity can pass between the shield plate 42 and the measuring unit 35, it is possible to cancel out any stray capacitance produced by the fixing screws 35. Also, since the shield plate 42 is formed in the shape of a thin plate, it is possible to provide sufficient clearance between the arm 12 and the probed object during probing, and as a result it is possible to avoid a situation where probing is obstructed.

Also, although an example has been described where the arms 11, 12 (the arms 111, 112) formed of metal are used, it is also possible to use a configuration where arms (the first arm and the second arm) made of resin formed by injection molding or the like are used. Here, when arms made of resin are used, by forming a conductive film (conductive layer) on all or part of the surfaces of the arms, it is also possible to produce a configuration where the probe pin(s) 2 and the holding portion 13 (the holding portion 113) are electrically connected via the conductive film. Also, when arms made of resin are used in a probe unit equipped with a pair of probe pins 2 like the probe unit 101 described above, when cutting out a pair of arms (the pair of arms 111 and the pair of arms 112 in the probe unit 101) that have been fabricated as an integrated body, it is possible to use a configuration where the arms are held by a holding portion in a state where the base end portions are still linked together (one example of a configuration where the arms are separated from at least a vicinity of the base end portions to the front end portions). As a specific example where such configuration is used, a probe unit 601 depicted in FIG. 25 will now be described. Note that component elements that are the same as the probe units 1, 101, 1A, 1B described above have been assigned the same numerals and duplicated description thereof is omitted.

Figure 27:
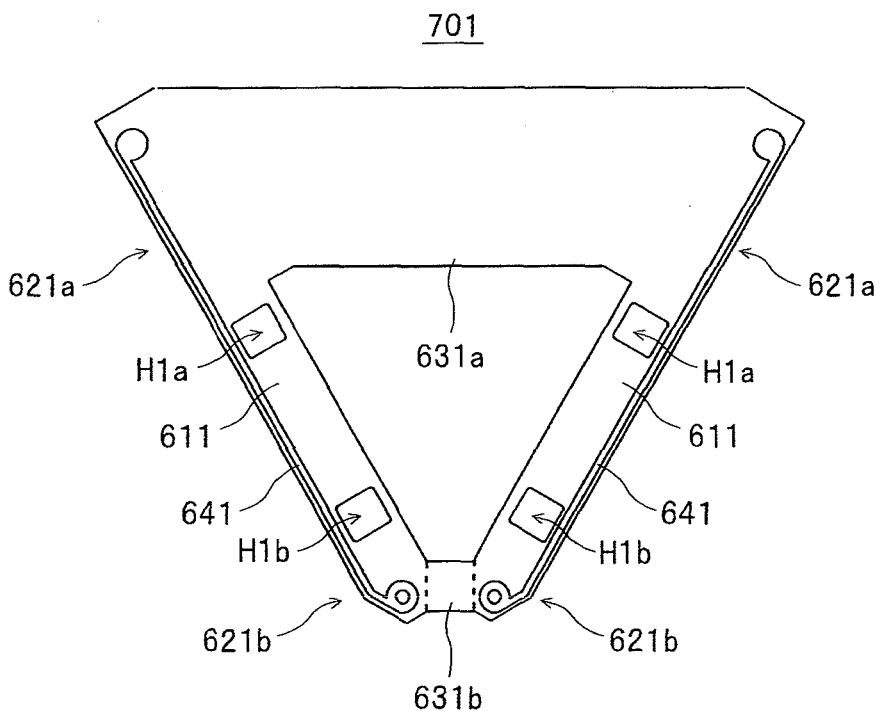
FIG. 27 is a second diagram useful in explaining the method of manufacturing another probe unit.

As depicted in FIG. 25, the probe unit 601 includes a pair of probe pins 2 and a support portion 603. The support portion 603 includes a pair of arms 611 (first arms), a pair of arms 612 (second arms), and a holding portion 613. As depicted in FIG. 27, the arms 611 are integrally fabricated of a nonconductive (insulating) material in a state where the base end portions 621a are linked together (the member in which the arms 611 are integrated is also referred to as the "intermediate body 701"), and as depicted in FIG. 25, the arms 611 are held by the holding portion 613 in a state where the base end portions 621a are linked. Also, the arms 611 are configured so that after both arms 611 have been integrally fabricated in a state where the positional relationship when the base end portions 621a are held by the holding portion 613 is maintained (i.e., after the intermediate body 701 has been fabricated), the range from the vicinity of the base end portions 621a to the front end portions 621b is separated in a state where the base end portions 621a are held by the holding portion. Here, with the probe unit 601, as depicted in FIG. 25, the positional relationship between the arms 611 when held by the holding portion 613 is a positional relationship where the arms 611 are adjacent on a single virtual plane and the arms 611 approach one another from the base end portions 621a toward the front end portions 621b. Also, as depicted in FIG. 27, conductive patterns 641 for electrically connecting the probe pins 2 to a circuit board testing apparatus or the like, not depicted, are formed on the arms 611.

Figure 29:
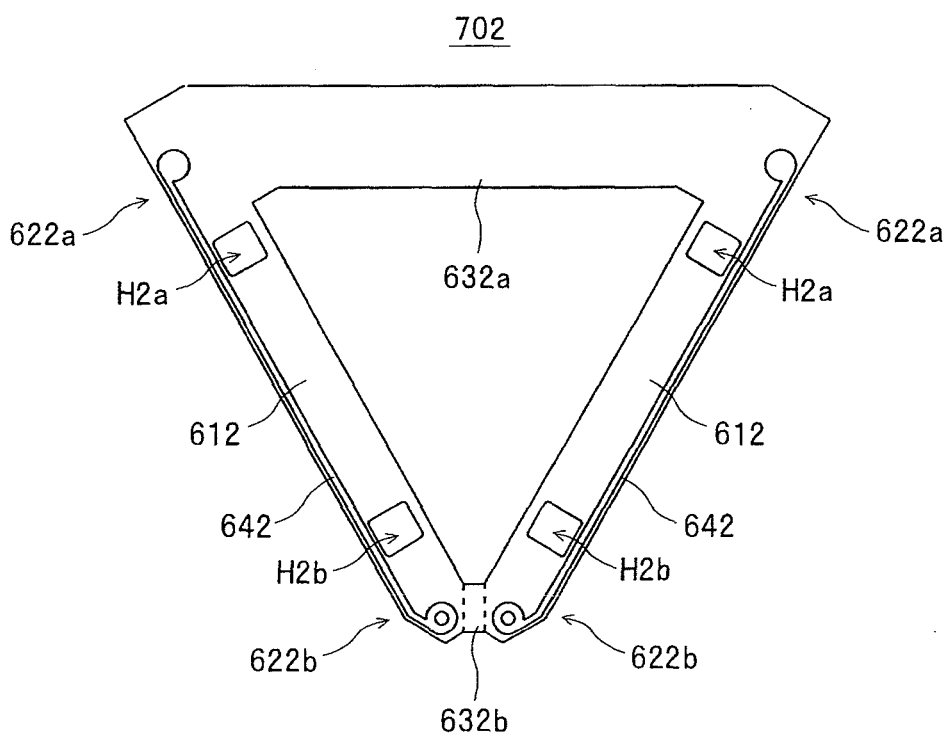
FIG. 29 is a fourth diagram useful in explaining the method of manufacturing another probe unit.

As depicted in FIG. 29, the arms 612 are integrally fabricated of a nonconductive material in a state where the base end portions 622a are linked together (the member in which the arms 612 are integrated is also referred to as the "intermediate body 702"), and as depicted in FIG. 25, the arms 612 are held by the holding portion 613 in a state where the base end portions 622a are linked. Also, in the same way as the arms 611, the arms 612 are configured so that after both arms 612 have been integrally fabricated in a state where the positional relationship when the base end portions 622a are held by the holding portion 613 is maintained (i.e., after the intermediate body 702 has been fabricated), the range from the vicinity of the base end portions 622a to the front end portions 622b is separated in a state where the base end portions 622a are held by the holding portion. As depicted in FIG. 25, the positional relationship between the arms 612 when held by the holding portion 613 is a positional relationship where the arms 612 are adjacent on a single virtual plane and the arms 612 approach one another from the base end portions 622a toward the front end portions 622b. Also, as depicted in FIG. 29, conductive patterns 642 for electrically connecting the probe pins 2 to a circuit board testing apparatus or the like, not depicted, are formed on the arms 612.

Figure 26:
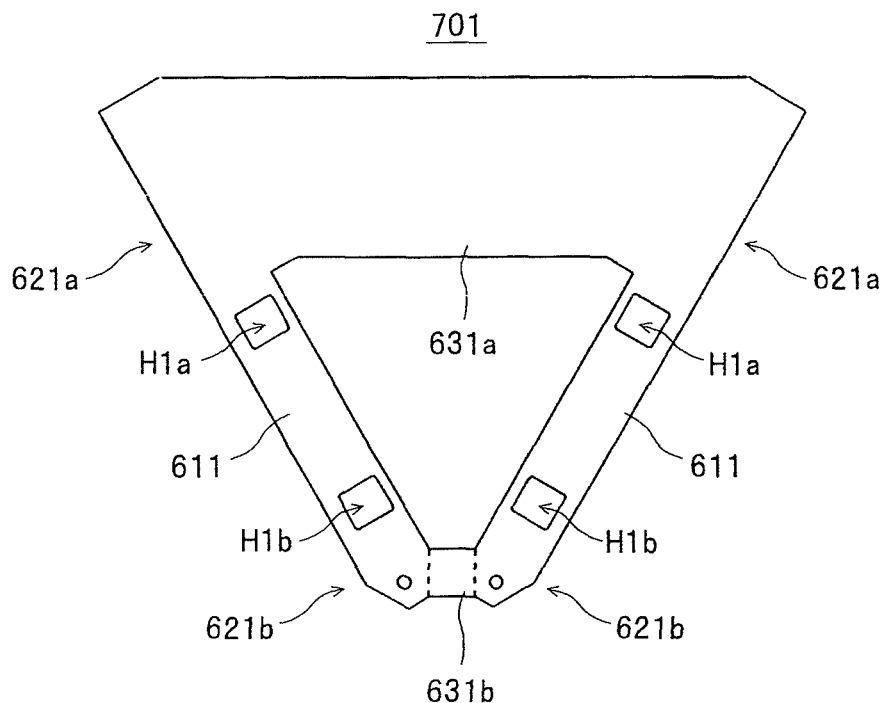
FIG. 26 is a first diagram useful in explaining a method of manufacturing another probe unit.

Next, a method of manufacturing the probe unit 601 will be described. As depicted in FIG. 26, the intermediate body 701 is fabricated using a nonconductive (insulating) material such as resin. In the intermediate body 701, the arms 611 are linked by the linking portions 631a, 631b in a state where the positional relationship when the base end portions 621a of the pair of arms 611 are held by the holding portion 613 (see FIG. 25) is maintained. As the method of fabricating the intermediate body 701, it is possible to use a method of fabricating using injection molding, a method of fabricating using milling, a method of fabricating using a 3D printer, and the like. Next, as depicted in FIG. 27, the conductive patterns 641 are formed from the base end portions 621a to the front end portions 621b of the arms 611 in the intermediate body 701.

Figure 28:
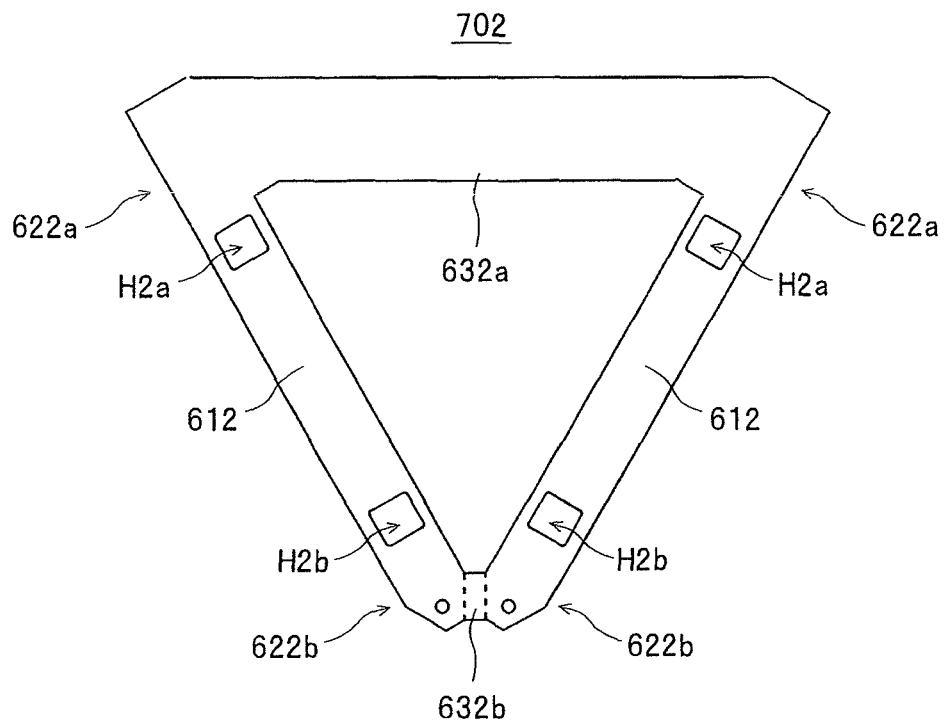
FIG. 28 is a third diagram useful in explaining the method of manufacturing another probe unit.

Next, as depicted in FIG. 28, the intermediate body 702 is fabricated according to the same method of fabricating as the method of fabricating the intermediate body 701 using a nonconductive material such as resin. In the intermediate body 702, the arms 612 are linked by the linking portions 632a, 632b in a state where the positional relationship when the base end portions 622a of the pair of arms 612 are held by the holding portion 613 (see FIG. 25) is maintained. After this, as depicted in FIG. 29, conductive patterns 642 are formed from the base end portions 622a to the front end portions 622b of the arms 612 in the intermediate body 702.

Next, the base end portion sides (the linking portions 631a, 632a) of the intermediate bodies 701, 702 are held by the holding portion 613. After this, the front end portion sides of the intermediate bodies 701, 702 are cut out by cutting the linking portions 631b, 632b on the front end portion 621b, 622b sides of the arms 611, 612 at the positions of the broken lines depicted in FIGS. 27, 29 to separate the arms 611, 612 from the vicinities of the base end portions 621a, 622a to the front end portion 621b, 622b. By doing so, the probe unit 601 is manufactured.

In the probe unit 601, as described above, the arms 611 and the arms 612 are integrally fabricated in a state where the base end portions 621a are linked together and the base end portions 622a are linked together, and are held by the holding portion 613 in a state where the base end portions 621a are linked together and the base end portions 622a are linked together. This means that according to the probe unit 601, it is possible to fabricate the arms 611 and the arms 612 in a state where the positional relationship between the arms 611 and the arms 612 when the arms 611 and the arms 612 are held by the holding portion 613 is maintained, and it is possible to hold (attach) the arms 611 and the arms 612 on the holding portion 613 with the positional relationship at the time of fabrication reliably maintained. This means that according to the probe unit 601, it is possible to suppress fluctuations in specification, such as the dimensions and modulus of elasticity, between the arms 611 and between the arms 612 due to fluctuations in materials and differences in fabrication conditions when fabricating the arms 611 and the arms 612, and also possible to reliably prevent the occurrence of positional displacements between the arms 611 and between the arms 612 when the arms 611 and the arms 612 are held by the holding portion 613. As a result, according to the probe unit 601 and a testing method that uses the probe unit 601, it is possible to carry out more accurate probing. Also, according to the probe unit 601, since it is possible to hold the pair of arms 611 and the pair of arms 612 on the holding portion 613 in a single operation, it is possible to sufficiently improve the assembly efficiency of the probe unit 601.

What is claimed is:

1. A prober comprising:
    a probe pin; and
    a support that supports the probe pin,
        wherein the support includes:
            a strip-shaped first arm and a strip-shaped second arm that are oriented to face one another and are spaced apart from each other in a direction of probing that is defined in a direction extending from a fixed end of the probe pin towards a tip end of the probe pin when the probe pin is caused to probe a probed object;
            a holder that holds base end portions of the first and second arms; and
            a linkage portion that is defined by the interconnection between the probe pin and the front end portions of the first and second arms wherein the support is configured to allow linear movement or approximately linear movement of the probe pin in an opposite direction to the direction of probing, and
            each of the first and second arms having a respective forward positioned through-hole formed at a position that is closer to the front end portion than the base end portion of the respective one of the first and second arms,
        each of the first and second arms having a respective rearward positioned through-hole formed at a position that is closer to the base end portion than the front end portion of the respective one of the first and second arms,
        wherein the linkage portion is further defined by a central arm portion extending between and connecting the respective forward and rearward positioned through-holes of each of the first and second arms, and formation positions of each of the respective forward and rearward positioned through-holes function as joints of the linkage portion, which allow the respective central arm portion to pivot about the respective rearward positioned through-hole.

2. The prober according to claim 1,
    wherein the first and second arms are formed so that a width of respective pair of edge portions, extending between respective front end and base end portions, in a width direction of the through-holes widens along a length direction of the first and second arms as a distance from the central arm portion increases.

3. The prober according to claim 2,
    wherein the first and second arms are formed so that the respective pair of edge portions that are opposite one another with the through-holes in between produce a shape with line symmetry about a center line along the length direction that passes a center in the width direction of the first and the second arms as an axis of symmetry.

4. The prober according to claim 3,
    wherein the probe pin is fixed to the front end portion of the first arm and to the front end portion of the second arm.

5. The prober according to claim 2,
    wherein the probe pin is fixed to the front end portion of the first arm and to the front end portion of the second arm.

6. The prober according to claim 1,
wherein the probe pin is fixed to the front end portion of the first arm and to the front end portion of the second arm.

7. The prober according to claim 1,
wherein the first and second arms include ribs formed in the respective central arm portion along the length direction of the first and second arms.

8. The prober according to claim 1,
further comprising another probe pin, the strip-shaped first arm comprising another first arm, and the strip-shaped second arm comprising another second arm, wherein the probe pin and the another probe pin forms a pair of the probe pins, wherein the another first arm and the first arm forms a pair of the first arms; wherein the another second arm and the second arm forms a pair of the second arms, and
wherein the holder holds the base end portions of the first arms in a state where the pair of first arms extend adjacent to one another and holds the base end portions of the second arms in a state where the pair of second arms extend adjacent to one another.

9. The prober according to claim 8,
wherein the first arms are constructed by integrally fabricating the first arms in a state where a positional relationship when the base end portions of the first arms are held by the holder is maintained and then separating a range of the first arms from at least a vicinity of the base end portions to the front end portions in a state where the base end portions are held by the holder, and
the second arms are constructed by integrally fabricating the second arms in a state where a positional relationship when the base end portions of the second arms are held by the holder is maintained and then separating a range of the second arms from at least a vicinity of the base end portions to the front end portions in a state where the base end portions are held by the holder.

10. The prober according to claim 9,
wherein the first arms are nonconductive, are integrally fabricated in a state where the base end portions are linked together, and are held by the holder in a state where the base end portions are still linked together, and
the second arms are nonconductive, are integrally fabricated in a state where the base end portions are linked together, and are held by the holder in a state where the base end portions are still linked together.

11. A method of manufacturing a prober that manufactures the prober according to claim 8, comprising:
fabricating the first arms by integrally fabricating the first arms in a state where a positional relationship when the base end portions of the pair of first arms are held by the holder is maintained and then separating a range of the first arms from at least a vicinity of the base end portions to the front end portions; and
fabricating the second arms by integrally fabricating the second arms in a state where a positional relationship when the base end portions of the pair of second arms are held by the holder is maintained and then separating a range of the second arms from at least a vicinity of the base end portions to the front end portions.

12. The method of manufacturing a prober according to claim 11,
wherein the range of the first arms from at least a vicinity of the base end portions to the front end portions is separated in a state where the base end portions of the integrally fabricated first arms are held by the holder in the state,
and
the range of the second arms from at least a vicinity of the base end portions to the front end portions is separated in a state where the base end portions of the integrally fabricated second arms are held by the holder.

13. The prober according to claim 1,
further comprising a shield plate that is conductive and is disposed, via an insulator, on a surface of an arm, out of the first arm and the second arm, that is positioned closer to the probed object during probing, the surface of the arm being a surface that faces the probed object.

14. A testing method that tests a circuit board, comprising probing a circuit board as a probed object with the probe pin of the prober according to claim 1, and
testing the circuit board based on electrical signals inputted and outputted via the probe pin.

* * * * *